(12) United States Patent
Brookes (10) Patent No.: US 9,384,884 B2
(45) Date of Patent: Jul. 5, 2016

(54) CURRENT TRANSFORMER

(75) Inventor: Matthew Brookes, Chelmsford (GB)

(73) Assignee: Rayleigh Instruments Limited, Rayleigh Essex (GB)

( * ) Notice: Subject to any disclaimer, the term of this patent is extended or adjusted under 35 U.S.C. 154(b) by 373 days.

(21) Appl. No.: 13/981,930

(22) PCT Filed: Jan. 13, 2012

(86) PCT No.: PCT/GB2012/050073
§ 371 (c)(1),
(2), (4) Date: Oct. 14, 2013

(87) PCT Pub. No.: WO2012/101421
PCT Pub. Date: Aug. 2, 2012

(65) Prior Publication Data
US 2014/0028287 A1    Jan. 30, 2014

(30) Foreign Application Priority Data

Jan. 26, 2011  (GB) .................................. 1101334.9

(51) Int. Cl.
*G01R 19/18*  (2006.01)
*H01F 27/40*  (2006.01)
(Continued)

(52) U.S. Cl.
CPC .............. *H01F 27/40* (2013.01); *G01R 15/185* (2013.01); *G01R 19/0092* (2013.01);
(Continued)

(58) Field of Classification Search
CPC .................................. H02M 1/00; G01M 1/00
See application file for complete search history.

(56) References Cited

U.S. PATENT DOCUMENTS

| 3,264,591 A | 8/1966 | D'Entremont |
| 4,728,914 A | 3/1988 | Morris et al. |

(Continued)

FOREIGN PATENT DOCUMENTS

| CN | 2771996 | 4/2006 |
| CN | 201319314 | 9/2009 |

(Continued)

OTHER PUBLICATIONS

Combined Search and Examination Report for corresponding Great Britain Application No. GB1101334.9 mailed May 14, 2012.
(Continued)

*Primary Examiner* — Jermele M Hollington
*Assistant Examiner* — Temilade Rhodes-Vivour
(74) *Attorney, Agent, or Firm* — Renner, Otto, Boisselle & Sklar, LLP (57) ABSTRACT

A current transformer is described which comprises a housing having one or more apertures, each for receiving a primary cable or busbar, one or more magnetic cores enclosed within the housing and being positioned proximate to respective ones of the apertures so that a magnetic field is produced in a magnetic core when a primary current flows through a primary cable or busbar received through the respective aperture, and one or more secondary windings enclosed within the housing, each secondary winding being wrapped around at least a portion of a respective magnetic core so that a secondary current is induced in a secondary winding when a magnetic field is produced in the respective magnetic core. Shunt circuitry is enclosed within the housing and is connected across the secondary windings to generate a respective voltage signal for each secondary winding. A connector socket is integrally mounted to the housing for outputting the voltage signals. In this way, the labor costs incurred during installation of the current transformer can be reduced, a risk of wiring errors can be avoided, and a risk of electrocution from secondary terminals being left open-circuit is removed.

36 Claims, 7 Drawing Sheets

(51) Int. Cl.
*G01R 15/18* (2006.01)
*H01F 38/30* (2006.01)
*H01F 38/32* (2006.01)
*H01F 38/38* (2006.01)
*G01R 19/00* (2006.01)
*G01R 1/00* (2006.01)
*H02M 1/00* (2006.01)
*G01M 1/00* (2006.01)

(52) U.S. Cl.
CPC ............... *H01F 38/30* (2013.01); *H01F 38/32* (2013.01); *H01F 38/38* (2013.01); *G01M 1/00* (2013.01); *G01R 1/00* (2013.01); *H02M 1/00* (2013.01)

(56) References Cited

U.S. PATENT DOCUMENTS

| | | | |
|---|---|---|---|
| 5,377,653 A * | 1/1995 | Hamada | F02P 7/026 123/146.5 A |
| 2001/0021605 A1 | 9/2001 | Bolam | |
| 2005/0040842 A1 * | 2/2005 | Ataman | G01R 31/34 324/765.01 |
| 2005/0126544 A1 * | 6/2005 | Ott | F02P 17/12 123/491 |
| 2006/0258204 A1 | 11/2006 | Preuhs et al. | |
| 2008/0084201 A1 * | 4/2008 | Kojori | G01R 19/0015 324/117 R |
| 2008/0203979 A1 * | 8/2008 | Su | H02J 3/1828 323/209 |
| 2009/0124119 A1 | 5/2009 | Austin | |
| 2011/0242710 A1 * | 10/2011 | Scherzinger | H02H 7/042 361/20 |
| 2012/0050923 A1 * | 3/2012 | Fuller | H02H 7/042 361/35 |
| 2012/0268106 A1 * | 10/2012 | Blake, Jr. | G01R 15/186 324/127 |

FOREIGN PATENT DOCUMENTS

| | | |
|---|---|---|
| EP | 1 102 072 | 5/2001 |
| FR | 2571539 | 2/1986 |
| GB | 658297 | 10/1951 |
| GB | 1 321 806 | 7/1973 |
| GB | 2 183 049 | 5/1982 |
| JP | 2000/295723 | 10/2000 |
| JP | 2006/344620 | 12/2006 |
| WO | 92/17044 | 10/1992 |

OTHER PUBLICATIONS

International Search Report for corresponding International Application No. PCT/GB2012/050073 mailed Sep. 9, 2012.
Second Examination Report or corresponding Great Britain Application No. GB1101334.9 mailed Oct. 29, 2013.

* cited by examiner

CURRENT TRANSFORMER

This application is a national phase of International Application No. PCT/GB2012/050073 filed Jan. 13, 2012 and published in the English language.

FIELD OF THE INVENTION

The present invention relates to the field of current transformers.

BACKGROUND OF THE INVENTION

Current transformers are used to scale down large primary AC electric currents to smaller electric currents which can be more easily and safely measured. Current transformers can be used to scale down single phase or multiple phase currents.

Figure 1A:
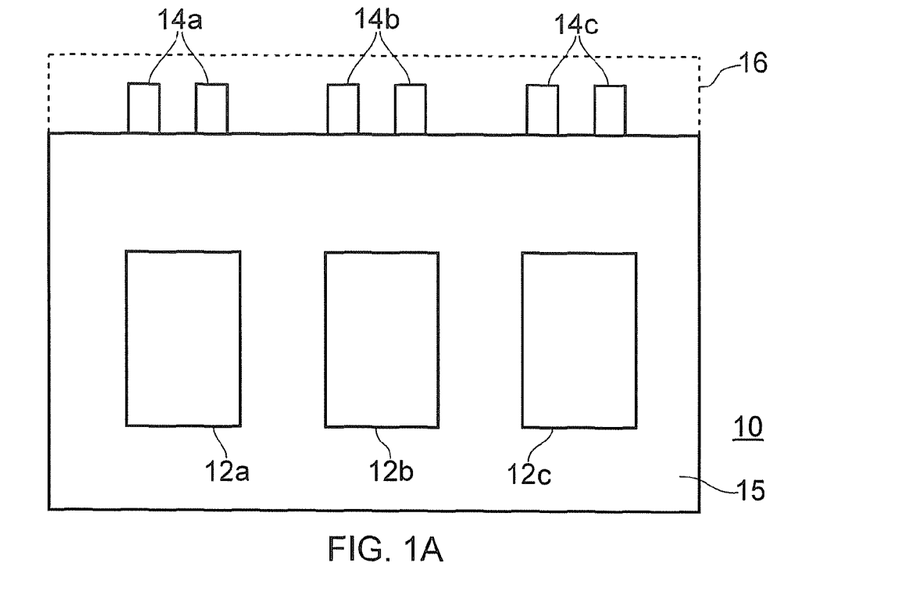
FIGS. 1A and 1B schematically illustrate a known current transformer.
Figure 1B:
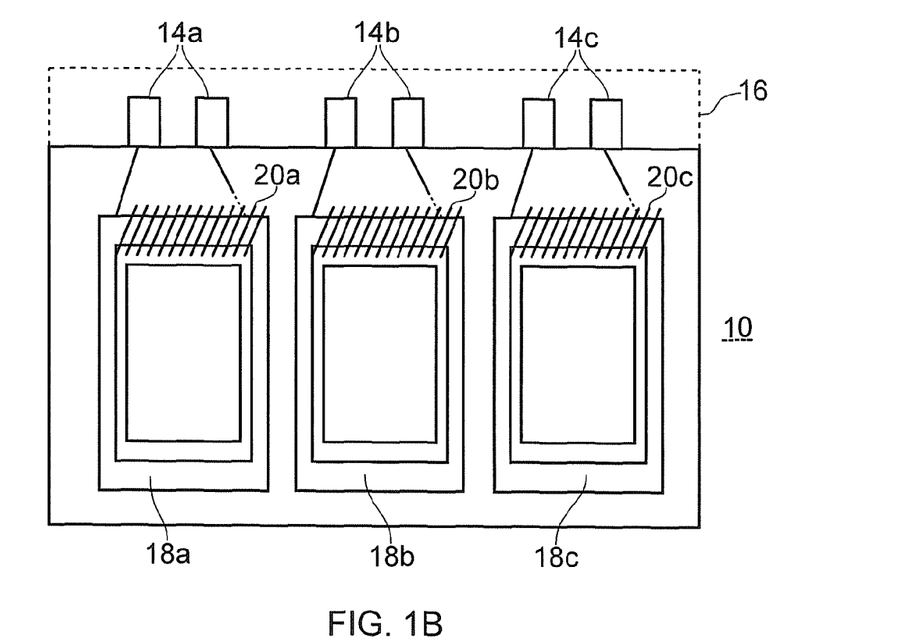

For example, a known three phase current transformer 10 is schematically illustrated in FIGS. 1A and 1B. In particular, FIG. 1A is an external view of such a current transformer 10. The current transformer 10 comprises a casing 15 having three apertures 12a, 12b and 12c, each of which is able to receive a cable or busbar. More specifically, a cable or busbar received through each of the apertures 12a, 12b, 12c is intended to correspond to a respective phase of a three phase power supply. It will be appreciated that each cable is able to pass completely through the current transformer casing 15, emerging to continue on to its destination. Also visible in FIG. 1A are six terminals arranged in three pairs, each pair corresponding to a respective phase of the three phase current transformer 10. The six terminals are protected by a cover 16.

FIG. 1B is an internal cross-section of the three phase current transformer 10 of FIG. 1A. Visible are three magnetic cores 18a, 18b, 18c which each surround a respective one of the apertures 12a, 12b, 12c. It will be appreciated that this arrangement puts each of the magnetic cores in proximity to a primary cable or busbar passing through one of the apertures 12a, 12b, 12c and carrying a particular phase of an electric power supply. Each of the magnetic cores 18a, 18b, 18c is provided with a secondary winding 20a, 20b, 20c wrapped around at least a portion of the respective magnetic core 18a, 18b, 18c. With this configuration, an electric current passing through the primary cable or busbar within one of the apertures 12a, 12b, 12c will produce a magnetic field in the respective magnetic core 18a, 18b, 18c which in turn induces a much smaller current in the respective secondary winding 20a, 20b, 20c. The ends of the secondary windings are connected to one of the pairs of terminals 14a, 14b, 14c. A separate measurement device (not shown) can be wired up to the terminals 14a, 14b, 14c to measure the amount of current passing through the secondary windings. The measurement device is able to estimate the amount of current passing through the primary cable or busbar based on the amount of current measured at the secondary windings and based on a known primary/secondary current ratio of the current transformer 10. This works because the amount of current induced in the secondary windings is proportional to the amount of current flowing through the primary cable or busbar.

One major disadvantage with the design of the current transformer 10 of FIGS. 1A and 1B is the amount of labour involved in connecting the secondary circuit (secondary windings and terminals) to a multi-function meter or the like. To achieve this, typically 12 terminals need to be loosened (6 on the transformer, 6 on the multi-function meter), 6 cables need routing, 12 cable ends need stripping, 12 crimp terminals need fitting to the exposed conductors, 12 heat shrink markers may need fitting and shrinking, 12 terminals need tightening and terminal covers need to be secured to protect contact with exposed terminals.

A common problem associated with the existing device is the relatively high probability of wiring errors, for example crossed wires, during connection of the devices. This can cause damage to the device or injury to a user.

Another major problem with current transformers in general is safety. In particular, if the secondary circuit is left open-circuit with no load across the terminals, a potentially lethal high voltage can be induced due to flux saturation if a current is caused to flow through the primary cable or busbar. This may cause arcing, and if the terminals are touched in this condition has the potential to cause severe injury or even death.

A three phase current transformer having a fly lead built (potted) into the case, and having an RJ11 type connector on the end of the fly lead, has previously been proposed.

SUMMARY OF THE INVENTION

Viewed from one aspect, the present invention provides a current transformer, comprising:

a housing having one or more apertures, each for receiving a primary cable or busbar;

one or more magnetic cores enclosed within the housing and being positioned proximate to respective ones of the apertures so that a magnetic field is produced in a magnetic core when a primary current flows through a primary cable or busbar received through the respective aperture;

one or more secondary windings enclosed within the housing, each secondary winding being wrapped around at least a portion of a respective magnetic core so that a secondary current is induced in a secondary winding when a magnetic field is produced in the respective magnetic core;

shunt circuitry enclosed within the housing and being connected across the secondary windings to generate a respective voltage signal for each secondary winding; and a connector socket integrally mounted to the housing for outputting the voltage signals.

In this way, the labour costs incurred during installation of the current transformer can be substantially reduced due to the 'plug and play' nature of the connector socket. Rather than wires being individually connected to the correct exposed terminals, a connector plug is simply inserted into the connector socket to provide a connection to a measurement device. Furthermore, the risk of wiring errors is eliminated, because the only connection to be made is to plug in a single cable.

In addition, the risk of electrocution from secondary terminals being left open-circuit is removed due to (a) the lack of exposed terminals, and (b) the secondary windings having shunts across them at all times. This means that the secondary circuit (windings) will remain loaded regardless of whether the data lead is connected to the current transformer. Moreover, the data cable itself will generally only be carrying very low power signals. Finally, the 'plug and play' nature of this arrangement makes it possible to provide great flexibility in terms of cable length. In particular, different lengths (and types) of cable can be provided to suit the particular application and environment in which the current transformer is being used.

The current transformer may be a single phase current transformer having one aperture, one magnetic core and one secondary winding. However, the current transformer is more preferably a three phase current transformer having three apertures each for receiving a cable or busbar of a respective phase of a three phase power supply, three respective magnetic cores, and three respective secondary windings, and wherein the shunt circuitry generates a respective voltage signal for each of the three phases of the power supply.

The shunt circuitry and the connector socket may be mounted to a circuit board located within the housing.

While a current will be generated in the secondary windings as long as the magnetic core is in proximity to the primary cable or busbar, preferably each magnetic core substantially surrounds the respective aperture, resulting in improved electromagnetic coupling between the primary cable and the magnetic core.

Rather than the current transformer being provided with open apertures for receiving a cable, the current transformer may be provided with busbars fixed within respective ones of the apertures. In this case primary cables may be connected to the fixed busbar in order for the amount of current flowing through the primary cables to be measured.

In the case of a single phase current transformer, the shunt circuitry may comprise a resistor connected across the secondary winding, the voltage drop across the resistor providing a voltage signal for output at the connector socket. Alternatively, the shunt circuitry may comprise a group of resistors connected in parallel across the secondary winding, the voltage drop across the group of resistors providing a voltage signal for output at the connector socket. The use of multiple resistors in parallel enables greater flexibility in setting an equivalent resistance value for the shunt circuitry.

In the case of a three phase current transformer, the shunt circuitry may comprise a first shunt resistor connected across a first of the three secondary windings, a second shunt resistor connected across a second of the three secondary windings, and a third shunt resistor connected across a third of the three secondary windings. The first, second and third shunt resistors may be connected together at one end at a common ground, the voltage drop between the common ground and the other end of each of the first, second and third shunt resistors providing voltage signals for the respective phases. Alternatively, the shunt circuitry may comprise a first shunt resistor group connected in parallel across a first of the three secondary windings, a second shunt resistor group connected in parallel across a second of the three secondary windings, and a third shunt resistor group connected in parallel across a third of the three secondary windings. Again, the use of multiple resistors in parallel enables greater flexibility in setting an equivalent resistance value for the shunt circuitry. The first, second and third shunt resistor groups are connected together at one end at a common ground, the voltage drop between the common ground and the other end of each of the first, second and third shunt resistor groups providing voltage signals for the respective phases.

It will be appreciated that any suitable connector and data cable configuration could be used. In one example, the socket is an RJ45 connector.

In one example, the full scale output of the secondary windings is 1 A. However, a full scale output of 5 A could instead be used, or any other suitable current rating, depending on the particular application. It will be appreciated that the full scale output is in practice dependent upon the full scale input current of the primary cable. A particular current transformer will have a specified primary to secondary current ratio, largely dependent on the number of secondary windings provided in the current transformer. It will therefore be understood that a specific current transformer configuration will be selected in dependence on the maximum primary current to be measured, and the desired output voltage signal. It is also possible to vary the number of primary turns (in practice to pass the primary cable through an aperture more than once) to alter the primary to secondary current ratio of a particular current transformer.

Similarly, any required output voltage rating for the shunt circuitry could be used, depending on the effective resistance of the shunt circuitry, and the current value of the secondary windings. In one example, the maximum output voltage of the shunt circuitry is 333 mV.

Viewed from another aspect, the present invention provides a measurement device operable to receive the one or more voltage signals output from the current transformer, and to estimate the amount of current carried by the primary cable or busbar in dependence on the received voltage signals.

Previously, measurement devices have included integral shunt circuitry. With embodiments of the present invention, the shunt circuitry is provided within the current transformer itself, and so is not required in the measurement device. The measurement device may be a multi-function meter or the like. Whereas previous measurement devices typically included terminals to permit the measurement device to be wired to a current transformer, with embodiments of the present invention, the measurement device is provided with a connector socket (for example an RJ45 socket) for receiving a data cable to provide a connection to the current transformer. Alternatively, the measurement device may be provided with a fixed data lead.

Viewed from another aspect, the present invention provides a system for measuring electric current in a primary cable or busbar, comprising:

a current transformer as described above; and a measurement device for receiving the one or more voltage signals output from the current transformer and estimating the amount of current carried by the primary cable or busbar in dependence on the received voltage signals.

The current transformer may further comprise protection circuitry enclosed within the housing and being connected across the secondary windings to limit the accessible voltage at the connector socket imposed by the secondary windings. Such a structure could be used as a backup form of protection in the event that the shunt circuitry should fail. For example, a single resistor across a secondary winding could form the shunt circuitry, with the protection circuitry being provided in parallel with the resistor circuitry to clamp the accessible voltage in the event that the resistor should fail. In one example, the protection circuitry comprises a first diode connected across the secondary winding and a second diode connected in parallel with the first diode across the secondary winding, the first and second diodes being connected across the secondary winding in opposite directions. Either instead of or in addition to the first and second diodes, a Transil diode may be connected across the secondary winding.

Viewed from another aspect, a current transformer is provided, which, comprises:

a housing having one or more apertures, each for receiving a primary cable or busbar;

one or more magnetic cores enclosed within the housing and being positioned proximate to respective ones of the apertures so that a magnetic field is produced in a magnetic core when a primary current flows through a primary cable or busbar received through the respective aperture;

one or more secondary windings enclosed within the housing, each secondary winding being wrapped around at least a portion of a respective magnetic core so that a secondary current is induced in a secondary winding when a magnetic field is produced in the respective magnetic core;

a connector socket integrally mounted to the housing for outputting the current generated by the secondary windings; and protection circuitry enclosed within the housing and being connected across the secondary windings to limit the accessible voltage at the connector socket imposed by the secondary windings.

In this alternative arrangement, shunt circuitry is not provided within the current transformer itself. Instead, the current transformer relies on an external shunt, in the form of measurement circuitry within a multi-meter for connection to the current transformer, for example.

The current transformer may be a single phase current transformer having one aperture, one magnetic core and one secondary winding. Alternatively, the current transformer may be a three phase current transformer having three apertures each for receiving a cable or busbar of a respective phase of a three phase power supply, three respective magnetic cores, and three respective secondary windings.

The protection circuitry and the connector socket may be mounted to a circuit board located within the housing. Each magnetic core may substantially surround the respective aperture. One or more busbars may be fixed within respective ones of the apertures. The socket may be an RJ45 connector. The maximum output current of the secondary windings may be one of 1 A and 5 A.

In the case of a single phase current transformer, the protection circuitry may comprise a first diode connected across the secondary winding and a second diode connected in parallel with the first diode across the secondary winding, the first and second diodes being connected across the secondary winding in opposite directions. Additionally, or in the alternative, the protection circuitry may comprise a Transil diode connected across the secondary winding.

In the case of a three phase current transformer, the protection circuitry may comprise a first set of diodes connected across a first of the three secondary windings, a second set of diodes connected across a second of the three secondary windings, and a third set of diodes connected across a third of the three secondary windings. Each set of diodes may comprise a first diode connected across a respective secondary winding and a second diode connected across the respective secondary winding in parallel with the first diode, the first and second diodes being connected across the secondary winding in opposite directions. Each set of diodes may comprise a Transil diode connected across a respective secondary winding. It will be appreciated that some degree of protection would be provided by using either the first and second opposed diodes or the Transil diode, but preferably both the first and second opposed diodes and the Transil diode are present.

Viewed from another aspect, there is provided a measurement device having shunt circuitry which when connected across the secondary windings, of a current transformer having protection circuitry as described above, via the connector socket is operable to generate a respective voltage signal for each secondary winding, and operable to estimate the amount of current carried by the primary cable or busbar in dependence on the received voltage signals.

Viewed from another aspect, there is provided a system for measuring electric current in a primary cable or busbar, comprising a current transformer having protection circuitry as described above, and a measurement device having shunt circuitry.

It will be appreciated that the use of diodes connected across the secondary windings results in a current signal being output at the connector socket. A current (rather than voltage) signal may be advantageous in alleviating possible pickup problems due to frequencies and general noise which may be present within the industrial environment within which current transformers may be installed.

BRIEF DESCRIPTION OF THE DRAWINGS

The above, and other objects, features and advantages of this invention will be apparent from the following detailed description of illustrative embodiments which is to be read in connection with the accompanying drawings, in which.

DESCRIPTION OF THE EXAMPLE EMBODIMENTS

Figure 2A:
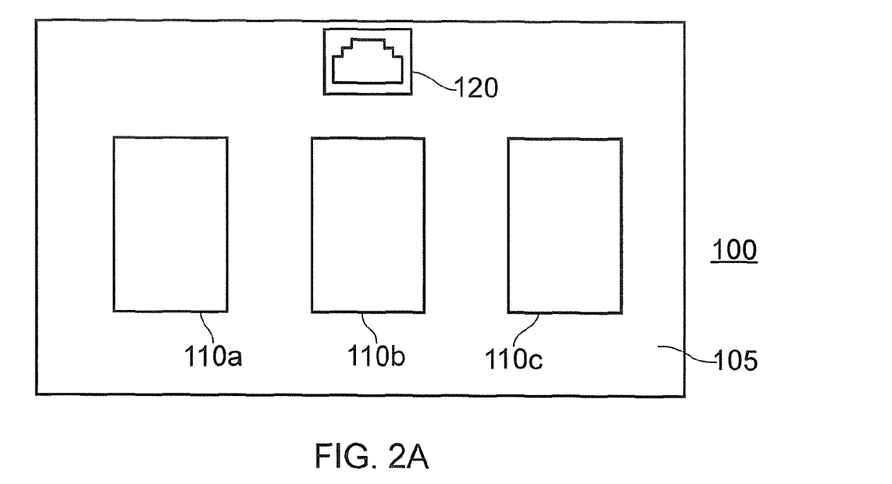
FIGS. 2A and 2B schematically illustrate a current transformer according to an embodiment of the invention.

FIG. 2A is an external schematic view of a current transformer 100 according to one embodiment. The current transformer comprises a casing 105 having three apertures 110$a$, 110$b$ and 110$c$, each of which is able to receive a cable or busbar. More specifically, a cable or busbar received through each of the apertures 110$a$, 110$b$, 110$c$ is intended to correspond to a respective phase of a three phase power supply. It will be appreciated that each cable is able to pass completely through the current transformer casing 105, emerging to continue on to its destination. Notably, in comparison with FIG. 1A (prior art), the current transformer 100 of FIG. 2A lacks terminals for connecting the current transformer 100 to an external measurement device. Instead, the current transformer 100 of FIG. 2A comprises a connector socket 120, in the present case an RJ45 socket. An RJ45 plug (not shown) of a data cable can be inserted into the RJ45 socket of the current transformer 100 to connect the current transformer 100 to an external measurement device.

Figure 2B:
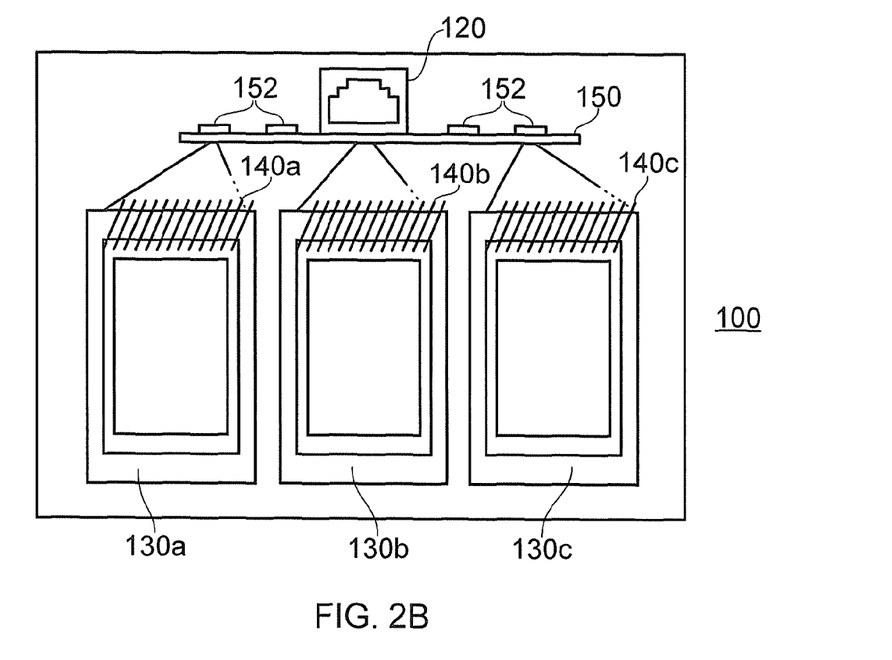

FIG. 2B is an internal cross-section of the three phase current transformer 100 of FIG. 2A. Visible are three magnetic cores 130$a$, 130$b$, 130$c$ which each surround a respective one of the apertures 110$a$, 110$b$, 110$c$. It will be appreciated that this arrangement puts each of the magnetic cores in proximity to a primary cable or busbar passing through one of the apertures 110$a$, 110$b$, 110$c$ and carrying a particular phase of an electric power supply. Each of the magnetic cores 130$a$, 130$b$, 130$c$ is provided with a secondary winding 140$a$, 140$b$, 140$c$ wrapped around at least a portion of the respective magnetic core 130$a$, 130$b$, 130$c$. With this configuration, an electric current passing through the primary cable or busbar within one of the apertures 110$a$, 110$b$, 110$c$ will produce a magnetic field in the respective magnetic core 130$a$, 130$b$, 130$c$ which in turn induces a much smaller current in the respective secondary winding 140$a$, 140$b$, 140$c$. The ends of the secondary windings are connected to a circuit board 150, which comprises shunt circuitry 152 which forms resistive connections across the ends of the secondary windings. The voltage drop across the resistive connection of a given secondary winding provides a voltage signal related to and indicative of the amount of current being driven through that secondary winding. In addition, the resistive connection provides a permanent load which avoids open-circuit safety problems.

The connector socket 120 is mounted on the circuit board 150 and is electrically connected to the shunt circuitry 152 to receive the voltage signals related to each of the secondary windings. In this way, the voltage signals can be safely and conveniently output to a measurement device external to the current transformer 100.

Figure 3:
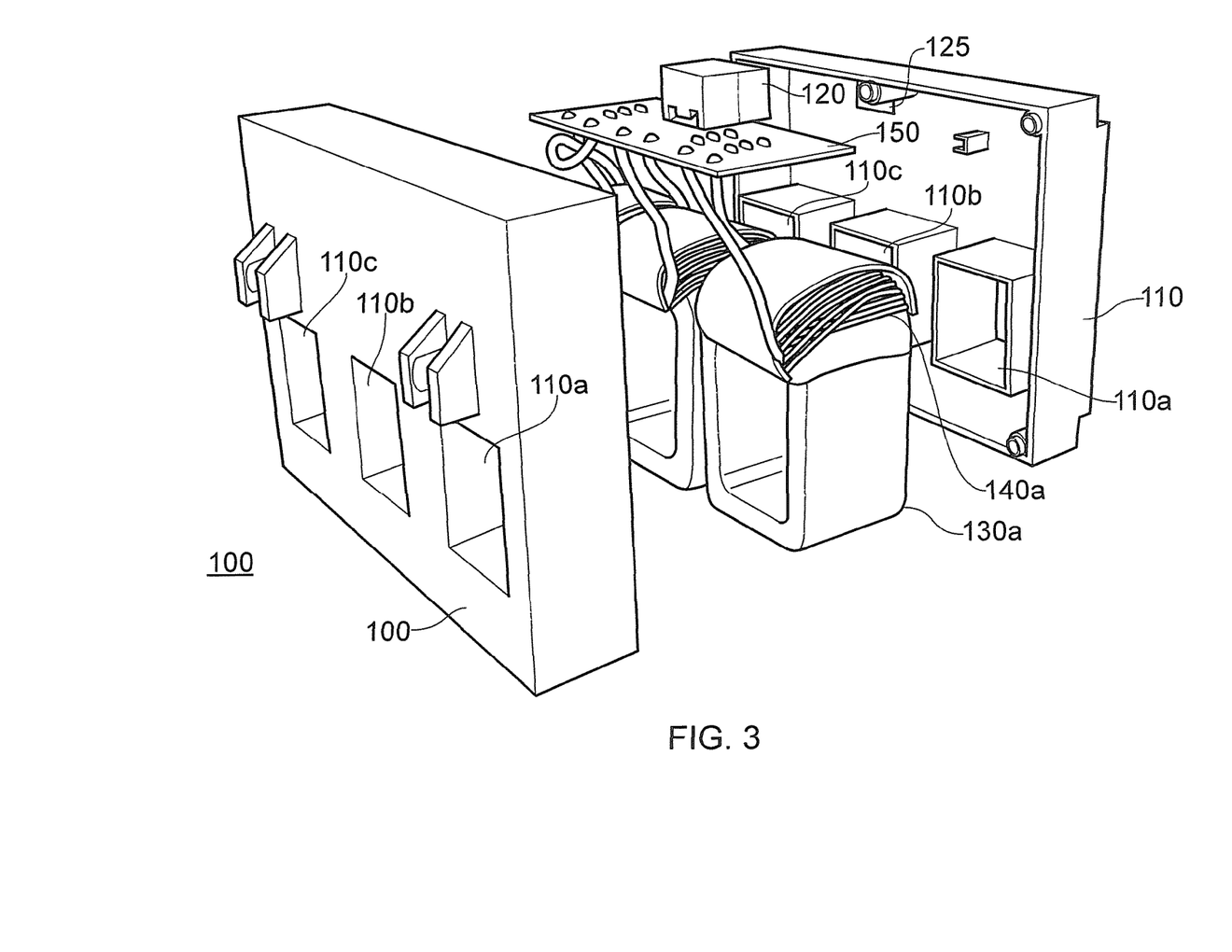
FIG. 3 presents another view of the current transformer of FIGS. 2A and 2B.

In FIG. 3, a disassembled view of the current transformer 100 of FIGS. 2A and 2B is schematically illustrated. The same elements of FIGS. 2A and 2B are identified in FIG. 3 using the same reference numerals. As can be seen, the casing 105 is provided in two halves, which can be closed around the internal components of the current transformer 100 to enclose all elements except for an exposed portion of the connector socket 120 (to permit a plug to be inserted). Each half of the casing 100 comprises the three apertures 110a, 110b, 110c which are in line with corresponding apertures in the ring-shaped magnetic cores 130a, 130b, 130c. For clarity only the magnetic core 130a is identified in FIG. 3. At the top portion of the magnetic core 130a the secondary winding 140a can be seen, with ends of the windings being connected to the back of the circuit board 150 located above the magnetic cores 130a, 130b, 130c. A similar configuration is provided for the secondary windings 140b and 140c corresponding to the magnetic cores 130b and 130c. Circuit elements of the shunt circuitry 152 can be seen mounted to the top surface of the circuit board 150. Also mounted to the top surface of the circuit board 150 is the connector socket 120. An aperture 125 is provided in one half of the casing 105 to expose a portion of the connector 120 to the external of the current transformer 100.

Figure 4:
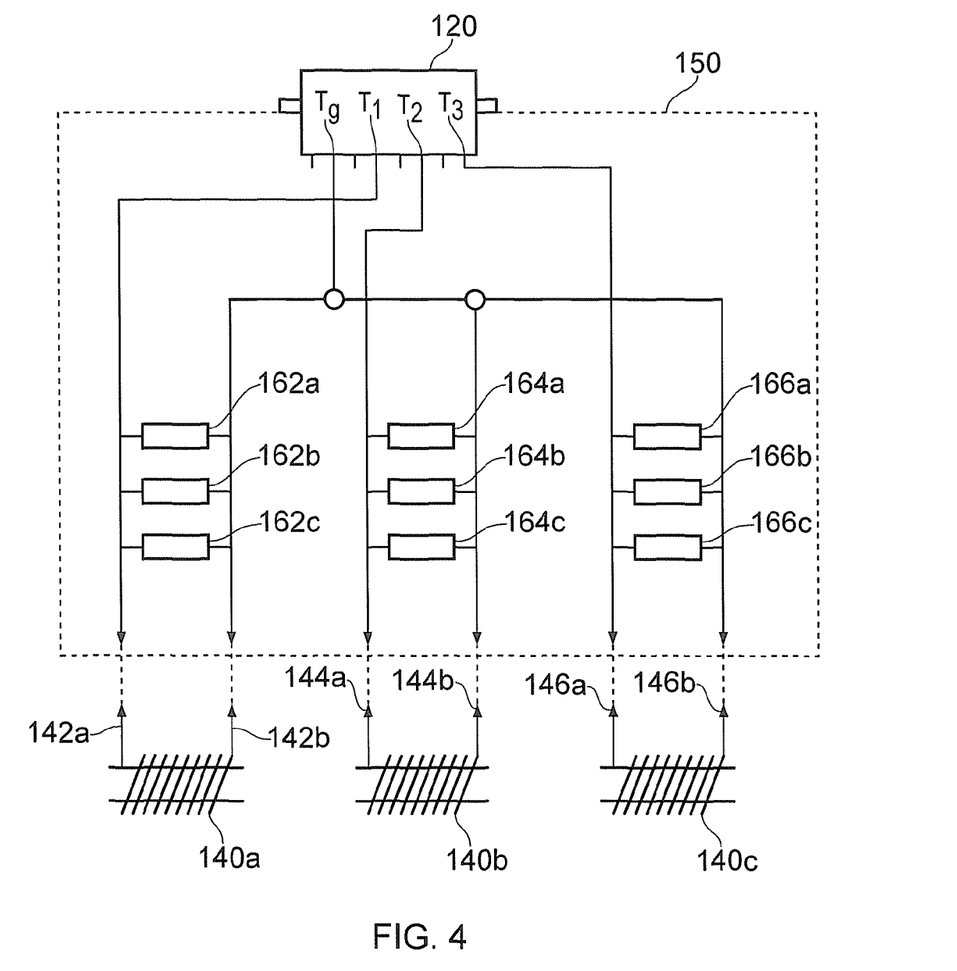
FIG. 4 schematically illustrates shunt circuitry according to an embodiment of the present invention.

FIG. 4 schematically illustrates the shunt circuitry 152 according to an embodiment of the invention. Visible at the bottom of FIG. 4 are the top portions of each of the magnetic cores, bearing the windings 140a, 140b and 140c. The winding 140a has ends 142a and 142b which are connected to the shunt circuitry 152. The winding 140b has ends 144a and 144b which are connected to the shunt circuitry 152. The winding 140c has ends 146a and 146b which are connected to the shunt circuitry 152. Visible at the top of FIG. 4 is the connector socket 120, mounted to the circuit board 150. The connector socket 120 is connected to various points of the shunt circuitry 152.

The shunt circuitry 152 can be considered to comprise three (related) portions. A first portion comprises a first group of resistors 162a, 162b and 162c which are connected in parallel across the ends 142a and 142b of the winding 140a. This group of resistors forms a load across the secondary winding 140a. The side of the load connected to the winding end 142b is connected to ground terminal $T_g$ of the connector socket 120. The other side of the load, connected to the winding end 142a is connected to a first voltage signal terminal $T_1$. The potential difference between $T_1$ and $T_g$, corresponding to a voltage drop over the load provided by the group of resistors 162a, 162b and 162c, provides a voltage signal indicative of the amount of current being driven through the secondary winding 140a, and thus the amount of current being driven through the corresponding primary cable or busbar.

Similarly, a second portion of the shunt circuitry 152 comprises a second group of resistors 164a, 164b and 164c which are connected in parallel across the ends 144a and 144b of the winding 140b. This group of resistors forms a load across the secondary winding 140b. The side of the load connected to the winding end 144b is connected to ground terminal $T_g$ of the connector socket 120. The other side of the load, connected to the winding end 144a is connected to a second voltage signal terminal $T_2$. The potential difference between $T_2$ and $T_g$, corresponding to a voltage drop over the load provided by the group of resistors 164a, 164b and 164c, provides a voltage signal indicative of the amount of current being driven through the secondary winding 140b, and thus the amount of current being driven through the corresponding primary cable or busbar.

Similarly, a third portion of the shunt circuitry 152 comprises a third group of resistors 166a, 166b and 166c which are connected in parallel across the ends 146a and 146b of the winding 140c. This group of resistors forms a load across the secondary winding 140c. The side of the load connected to the winding end 146b is connected to ground terminal $T_g$ of the connector socket 120. The other side of the load, connected to the winding end 146a is connected to a third voltage signal terminal $T_3$. The potential difference between $T_3$ and $T_g$, corresponding to a voltage drop over the load provided by the group of resistors 166a, 166b and 166c, provides a voltage signal indicative of the amount of current being driven through the secondary winding 140c, and thus the amount of current being driven through the corresponding primary cable or busbar.

The connector socket 120 therefore provides voltage signals derived from secondary windings 140a, 140b and 140c at terminals $T_1$, $T_2$ and $T_3$ respectively, as well as providing a grounded terminal $T_g$, for connection and output to a measurement device. The voltage signals will vary with respect to time in proportion to the amount of current being driven through the respective secondary windings, which in turn varies in proportion to the amount of current being driven through the respective primary cable or busbar. The voltage signals can therefore be used to infer the amount of current passing through the primary cable or busbar, based on a predictable current ratio between the primary cable and the secondary winding, and based on a predictable relationship between the current applied to the loads of the shunt circuitry and the voltage drop across those loads.

In FIG. 4, the three groups of resistors are connected together to a common ground. It will be appreciated that this may not be necessary for some applications. Furthermore, in FIG. 4, groups of resistors are used together in parallel. It would be appreciated that instead of this, a single resistor could be used as a load for each secondary winding.

For a single phase current transformer, only a single group, or a single resistor, will be required to form a load for the one secondary winding required for a single phase current transformer. For example, to adapt the circuit diagram of FIG. 4 to a single phase design, the windings 140b and 140c would be dispensed with, as well as the resistors 164a, b, c and 166a, b, c.

Figure 5:
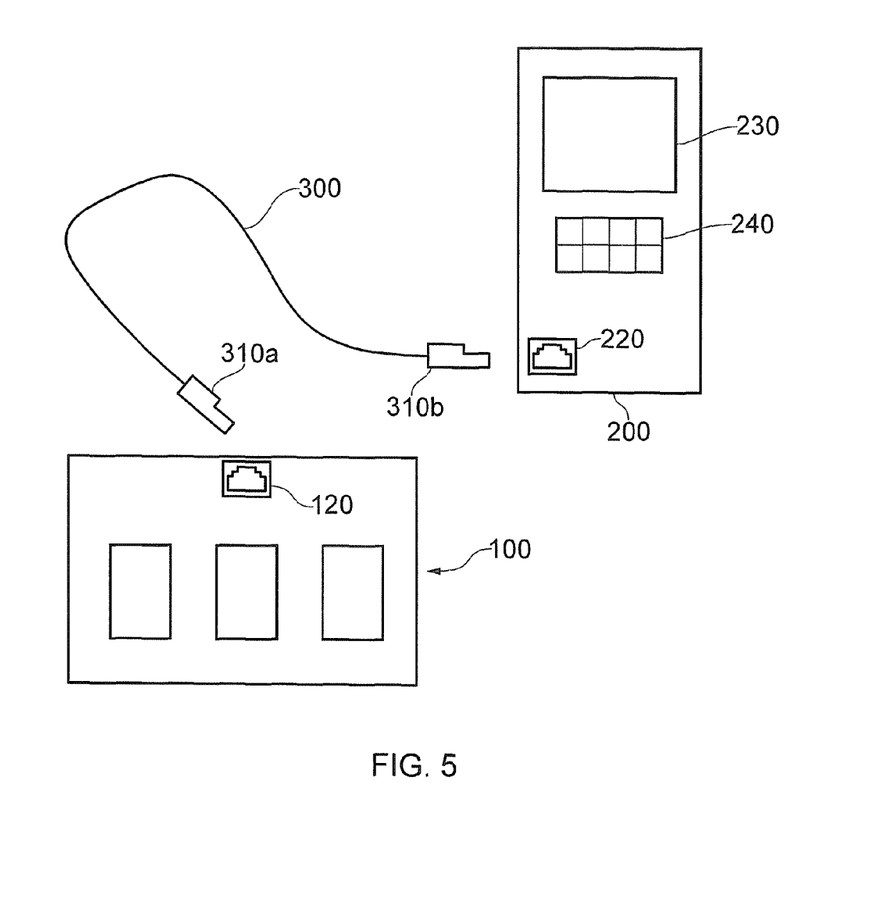
FIG. 5 schematically illustrates a current measurement system according to an embodiment of the present invention.

FIG. 5 schematically illustrates a current measurement system according to an embodiment of the present invention. The current measurement system comprises a current transformer as described above in relation to FIGS. 2, 3 and 4, as well as a measurement device 200. As described previously, the current transformer comprises a connector socket 120 mounted in the housing 100. This permits a data cable 300 to be used to connect the current transformer to the measurement device 100. The data cable 300 comprises a first plug 310a for insertion into the connector socket 120 of the current transformer. The data cable 300 also comprises a second plug 310*b* for insertion into a connector socket 220 of the measurement device 200. The measurement device 200 comprises a display 230 for displaying voltage and current measurements relating to the current transformer and the primary cable to which the current transformer is being applied. The measurement device 200 also comprises a user interface 240 (for example buttons and/or switches) permitting the user to interact with the measurement device. It will be appreciated that the measurement device 200 is exemplary, and other types of devices, such as general purpose computers, could be used if provided with appropriate interface circuitry for receiving the voltage signal via the data cable 300.

Figure 6:
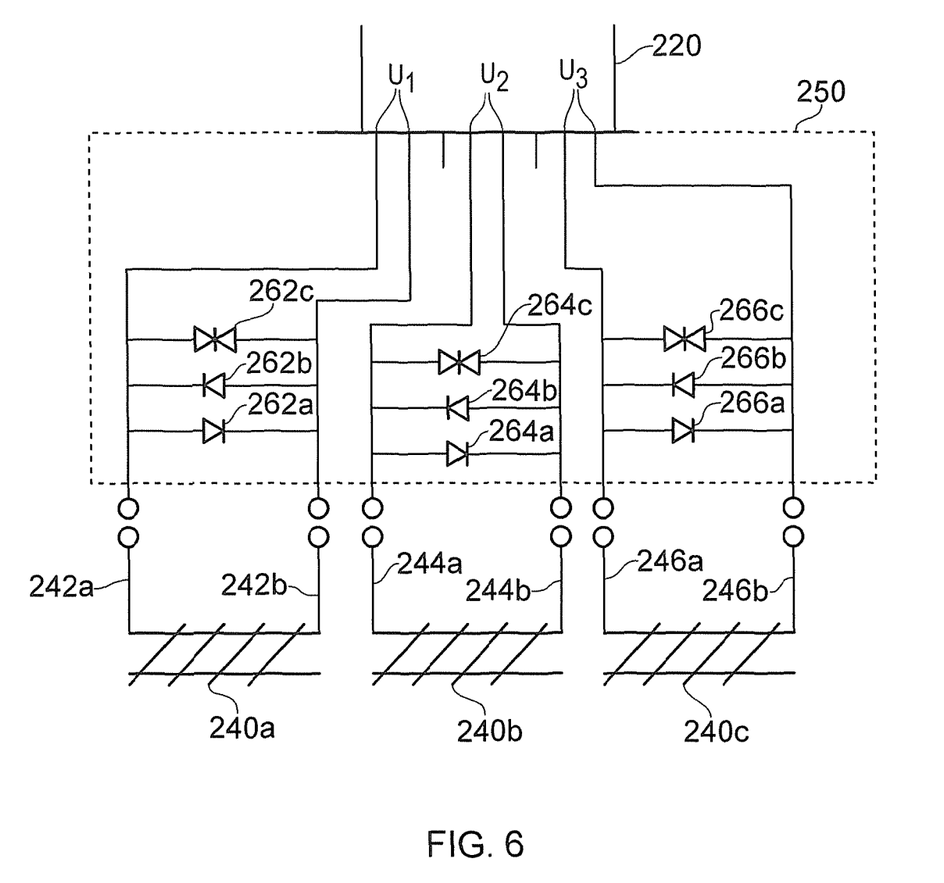
FIG. 6 schematically illustrates protection circuitry according to an alternative embodiment of the present invention.

FIG. 6 schematically illustrates shunt circuitry according to an alternative embodiment. In this embodiment, shunt circuitry is not provided within the current transformer itself. Instead, external shunt circuitry is used to measure the current through the secondary winding (and by inference the primary cable or busbar). It will therefore be appreciated that this type of current transformer is intended to support a current output signal at the connector socket. Without shunt circuitry being provided internally of the current transformer, the open-circuit safety concerns referred to above become an issue. To alleviate this, protection circuitry is provided in the place of the shunt circuitry. The purpose of the protection circuitry is to clamp the accessible voltage at the connector socket imposed by the secondary circuit (when it is not loaded with an external shunt) to an acceptable level.

Visible at the bottom of FIG. 6 are the top portions of each of the magnetic cores, bearing the windings 240*a*, 240*b* and 240*c*. The winding 240*a* has ends 242*a* and 242*b* which are connected to the protection circuitry on a circuit board 250 (analogous to the circuit board 150 of FIG. 4). The winding 240*b* has ends 244*a* and 244*b* which are connected to the protection circuitry on the circuit board 250. The winding 240*c* has ends 246*a* and 246*b* which are connected to the protection circuitry on the circuit board 250. Visible at the top of FIG. 4 is a connector socket 220, mounted to the circuit board 250, and connected to the protection circuitry and both ends of the secondary windings.

The protection circuitry on the circuit board 250 can be considered to comprise three portions. A first portion comprises a first group of diodes 262*a*, 262*b* and 262*c* which are connected in parallel across the ends 242*a* and 242*b* of the winding 240*a*. This group of diodes serves as a voltage clamp across the secondary winding 240*a* when no external shunt (of for example a current measuring circuit) is connected across the secondary winding 240*a*. Each side of the voltage clamp (and thus each end of the secondary winding 240*a*) is connected to a terminal $U_1$ of the connector socket 220. When a current measuring device is connected across the terminals $U_1$, then the current running through the secondary winding 240*a* can be measured, and the voltage clamp will have no effect. The measured current through the secondary winding 240*a* is in turn indicative of the amount of current being driven through the corresponding primary cable or busbar.

Similarly, a second portion of the protection circuitry on the circuit board 250 comprises a second group of diodes 264*a*, 264*b* and 264*c* which are connected in parallel across the ends 244*a* and 244*b* of the winding 240*b*. This group of diodes serves as a voltage clamp across the secondary winding 240*b* when no external shunt is connected across the secondary winding 240*b*. Each side of the voltage clamp (and thus each end of the secondary winding 240*b*) is connected to a terminal $U_2$ of the connector socket 220. When a current measuring device is connected across the terminals $U_2$, then the current running through the secondary winding 240*b* can be measured, and the voltage clamp will have no effect. The measured current through the secondary winding 240*b* is in turn indicative of the amount of current being driven through the corresponding primary cable or busbar.

Similarly, a third portion of the shunt circuitry on the circuit board 250 comprises a second group of diodes 266*a*, 266*b* and 266*c* which are connected in parallel across the ends 246*a* and 246*b* of the winding 240*c*. This group of diodes serves as a voltage clamp across the secondary winding 240*c* when no current measuring circuit is connected across the secondary winding 240*c*. Each side of the voltage clamp (and thus each end of the secondary winding 240*c*) is connected to a terminal $U_3$ of the connector socket 220. When a current measuring device is connected across the terminals $U_3$, then the current running through the secondary winding 240*c* can be measured, and the voltage clamp will have no effect. The measured current through the secondary winding 240*c* is in turn indicative of the amount of current being driven through the corresponding primary cable or busbar.

The connector socket 220 therefore permits current signals derived from secondary windings 240*a*, 240*b* and 240*c* at terminal groups $U_1$, $U_2$ and $U_3$ respectively, to be drawn through a measurement device. The current signals represent the amount of current being driven through the respective secondary windings, which in turn varies in proportion to the amount of current being driven through the respective primary cable or busbar. The current signals can therefore be used to infer the amount of current passing through the primary cable or busbar, based on a predictable current ratio between the primary cable and the secondary winding.

For a single phase current transformer, only a single group of diodes will be required to act as a voltage clamp for the one secondary winding required for a single phase current transformer. For example, to adapt the circuit diagram of FIG. 6 to a single phase design, the windings 240*b* and 240*c* would be dispensed with, as well as the corresponding groups of diodes.

The operation of the voltage clamp circuitry will now be explained with respect to FIG. 7, which schematically illustrates the circuitry associated with a single phase. This could represent the only phase of a single phase current transformer, or one of the phases of a three phase current transformer.

Figure 7:
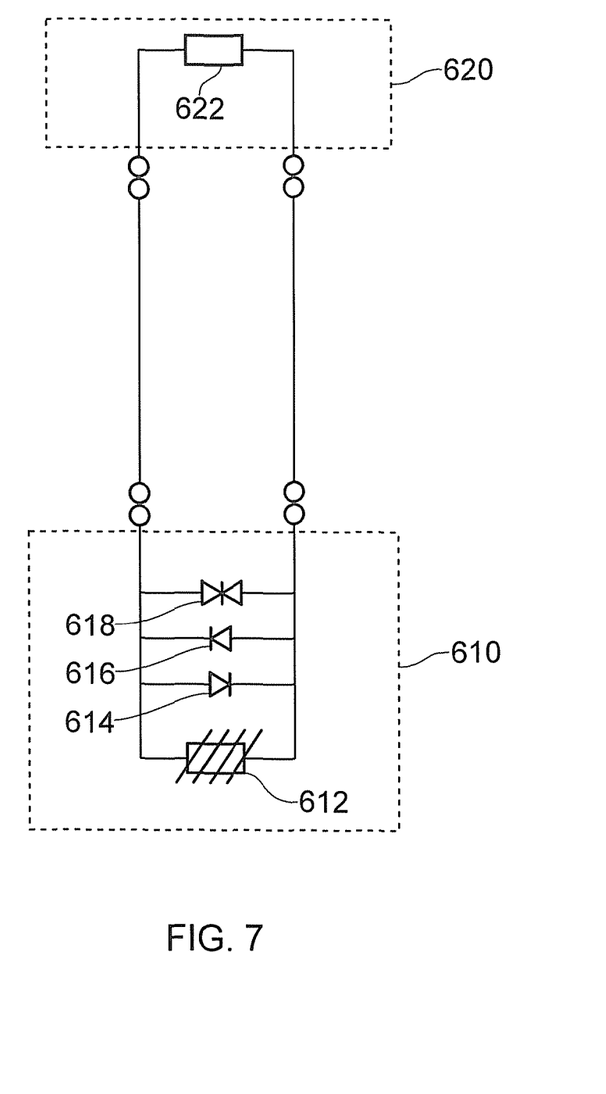
FIG. 7 schematically illustrates a single phase of protection circuitry of the alternative embodiment coupled to an integral shunt of a multi-function meter.

Shown in FIG. 7 is a secondary circuit 610 comprising a secondary winding 612, a first diode 614 connected across the secondary winding 612 in a first direction, a second diode 616 connected across the secondary winding 612 in a secondary direction opposite to the first direction, and a Transil diode 618. Also shown in FIG. 6 is the integral shunt resistor 622 of a current measurement circuit 620 which is connected to the secondary circuit 610 of the current transformer. The current measurement circuit 620 may be part of a multi-function meter. The current measurement circuit 620 monitors the voltage drop across the integral shunt resistor 622, which is connected across the secondary winding 612 when the multi-function meter is plugged into the current transformer via the socket. As the current flowing through the integral shunt resistor 622 increases, so does the voltage drop across it. In this way, the current signal generated as an output from the secondary circuit 610 of the current transformer is converted into a voltage signal at the current measurement circuit 620 and handled within the multi-function meter. In particular, the microprocessor of the multi-meter may be provided with circuitry which measures the voltage drop across the integral shunt resistor 622 and converts the read value into a digital value which the microprocessor can understand, process and display. The voltage drop across the integral shunt resistor 622 may be of order 100 mV.

When in normal use as described above, the voltage drop seen by the diodes 614 and 616 will be well below the forward voltage required for the diodes to conduct, and therefore the diodes will not affect the signal. The voltage drop seen by the diodes 614, 616 in normal use may be for example around 100 mV across the shunt resistor plus a negligible voltage drop of the cable connecting the current transformer to the multimeter. This is lower than the 0.6V typical forward voltage for a diode.

When the measurement circuit 620 is disconnected from the secondary circuit 610 while current is running through the primary cable or busbar, then the voltage seen by the diodes will begin to rise to approximately 0.6V (for example), at which point the diode forward voltage of the diodes 614, 616 will be exceeded and the diodes 614, 616 will begin to conduct. This serves to clip the output waveform and clamp the voltage accessible at the connector socket of the current transformer to a safe level. The secondary current will be flowing through the diodes 614, 616 with approximately a 0.6V voltage drop when the current transformer is in an unplugged (open circuit) state with current running through the primary cable or busbar. It will be appreciated that the diode 614 serves to limit the current flowing in one direction through the secondary circuit 610 while the diode 616 serves to limit the current flowing in the other direction through the secondary circuit 612.

The diode 618 is a Transil diode, which is fitted as a secondary method of protection in case the diodes 614, 616 fail for any reason. If this happens then the Transil diode would serve to limit the accessible voltage at the output socket of the current transformer to the chosen Transil diode level.

It will be appreciated that in the case of the shunt circuitry of FIG. 4, an integral shunt is not required in the measurement device 200, since the output from the shunt circuitry is a voltage signal which can be directly read and handled by a microprocessor of the measurement device 200. In contrast, in the case of the protection circuitry of FIGS. 6 and 7, a shunt will be required in the measurement device connecting to the current transformer, since the output from the shunt circuitry of the current transformer is a current signal which needs to be converted into a voltage signal which can be read and handled by the microprocessor of the measurement device 200.

The first described embodiment uses internal shunt circuitry to output a voltage signal at the connector socket of the current transformer. Safety results in part from the fact that a shunt is present across the secondary winding(s) at all times. The alternative embodiment does not use internal shunt circuitry, thus effectively outputting current signals. Safety in this case results from the protection circuitry, which forms a voltage clamp which would clamp the accessible voltage in the event that an external shunt is not connected (via the connector socket) to the secondary windings while current is running through the primary cable or busbar. It should be understood that the first and second embodiments can be combined, to result in a current transformer having both internal shunt circuitry (resistive shunt) resulting in a voltage output, and protection circuitry (for example coupled in parallel with the internal shunt circuitry across the secondary winding(s)) which would act as a back-up form of protection should the shunt circuitry (e.g. a resistor) fail.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. A current transformer, comprising:
   a housing having one or more apertures, each for receiving a primary cable or busbar;
   one or more magnetic cores enclosed within the housing and being positioned proximate to respective ones of the apertures so that a magnetic field is produced in a magnetic core when a primary current flows through a primary cable or busbar received through the respective aperture;
   one or more secondary windings enclosed within the housing, each secondary winding being wrapped around at least a portion of a respective magnetic core so that a secondary current is induced in a secondary winding when a magnetic field is produced in the respective magnetic core;
   shunt circuitry enclosed within the housing and being connected across the secondary windings to generate a respective voltage signal for each secondary winding; and
   a connector socket integrally mounted to the housing for outputting the voltage signals;
   wherein the current transformer is a three phase current transformer having three apertures each for receiving a cable or busbar of a respective phase of a three phase power supply, three respective magnetic cores, and three respective secondary windings, and wherein the shunt circuitry generates a respective voltage signal for each of the three phases of the power supply; and
   wherein the shunt circuitry comprises a first shunt resistor connected across a first of the three secondary windings, a second shunt resistor connected across a second of the three secondary windings, and a third shunt resistor connected across a third of the three secondary windings.

2. A current transformer according to claim 1, wherein the current transformer is a single phase current transformer having one aperture, one magnetic core and one secondary winding.

3. A current transformer according to claim 2, wherein the shunt circuitry comprises a resistor connected across the secondary winding, the voltage drop across the resistor providing a voltage signal for output at the connector socket.

4. A current transformer according to claim 2, wherein the shunt circuitry comprises a group of resistors connected in parallel across the secondary winding, the voltage drop across the group of resistors providing a voltage signal for output at the connector socket.

5. A current transformer according to claim 1, wherein the shunt circuitry and the connector socket are mounted to a circuit board located within the housing.

6. A current transformer according to claim 1, wherein each magnetic core substantially surrounds the respective aperture.

7. A current transformer according to claim 1, further comprising one or more busbars fixed within respective ones of the apertures.

8. A current transformer according to claim 1, wherein the first, second and third shunt resistors are connected together at one end at a common ground, the voltage drop between the common ground and the other end of each of the first, second and third shunt resistors providing voltage signals for the respective phases.

9. A current transformer according to claim 1, wherein the socket is an RJ45 connector.

10. A current transformer according to claim 1, wherein the maximum output current of the secondary windings is one of 1 A and 5 A.

11. A current transformer according to claim 1, wherein the maximum output voltage of the shunt circuitry is 333 mV.

12. A system for measuring electric current in a primary cable or busbar, comprising:
a current transformer according to claim 1; and
a measurement device for receiving the one or more voltage signals output from the current transformer and estimating the amount of current carried by the primary cable or busbar in dependence on the received voltage signals.

13. A current transformer according to claim 1, further comprising protection circuitry enclosed within the housing and being connected across the secondary windings to limit the accessible voltage at the connector socket imposed by the secondary windings.

14. A current transformer according to claim 13, wherein the protection circuitry comprises a first diode connected across the secondary winding and a second diode connected in parallel with the first diode across the secondary winding, the first and second diodes being connected across the secondary winding in opposite directions.

15. A current transformer according to claim 13, wherein the protection circuitry comprises a Transil diode connected across the secondary winding.

16. A three phase current transformer, comprising:
a housing having three apertures, each for receiving a cable or busbar of a respective phase of a three phase power supply;
three magnetic cores enclosed within the housing and being positioned proximate to respective ones of the apertures so that a magnetic field is produced in a magnetic core when a primary current flows through a primary cable or busbar received through the respective aperture;
three secondary windings enclosed within the housing, each secondary winding being wrapped around at least a portion of a respective magnetic core so that a secondary current is induced in a secondary winding when a magnetic field is produced in the respective magnetic core;
shunt circuitry enclosed within the housing and being connected across the respective secondary winding to generate a respective voltage signal for each secondary winding; and
a connector socket integrally mounted to the housing for outputting the voltage signals; and
wherein the shunt circuitry comprises a first shunt resistor group connected in parallel across a first of the three secondary windings, a second shunt resistor group connected in parallel across a second of the three secondary windings, and a third shunt resistor group connected in parallel across a third of the three secondary windings.

17. A current transformer according to claim 16, wherein the first, second and third shunt resistor groups are connected together at one end at a common ground, the voltage drop between the common ground and the other end of each of the first, second and third shunt resistor groups providing voltage signals for the respective phases.

18. A current transformer according to claim 16, wherein the shunt circuitry and the connector socket are mounted to a circuit board located within the housing.

19. A current transformer according to claim 16, wherein each magnetic core substantially surrounds the respective aperture.

20. A current transformer according to claim 16, further comprising one or more busbars fixed within respective ones of the apertures.

21. A system for measuring electric current in a primary cable or busbar, comprising:
a current transformer according to claim 16; and
a measurement device for receiving the one or more voltage signals output from the current transformer and estimating the amount of current carried by the primary cable or busbar in dependence on the received voltage signals.

22. A current transformer according to claim 16, further comprising protection circuitry enclosed within the housing and being connected across the secondary windings to limit the accessible voltage at the connector socket imposed by the secondary windings.

23. A current transformer according to claim 22, wherein the protection circuitry comprises a first diode connected across the secondary winding and a second diode connected in parallel with the first diode across the secondary winding, the first and second diodes being connected across the secondary winding in opposite directions.

24. A current transformer according to claim 22, wherein the protection circuitry comprises a Transil diode connected across the secondary winding.

25. A current transformer, comprising:
a housing having one or more apertures, each for receiving a primary cable or busbar;
one or more magnetic cores enclosed within the housing and being positioned proximate to respective ones of the apertures so that a magnetic field is produced in a magnetic core when a primary current flows through a primary cable or busbar received through the respective aperture;
one or more secondary windings enclosed within the housing, each secondary winding being wrapped around at least a portion of a respective magnetic core so that a secondary current is induced in a secondary winding when a magnetic field is produced in the respective magnetic core;
a connector socket integrally mounted to the housing for outputting the current generated by the secondary windings; and
protection circuitry enclosed within the housing and being connected across the secondary windings to limit the accessible voltage at the connector socket imposed by the secondary windings;
wherein the current transformer is a three phase current transformer having three apertures each for receiving a cable or busbar of a respective phase of a three phase power supply, three respective magnetic cores, and three respective secondary windings; and
wherein the protection circuitry comprises a first set of diodes connected across a first of the three secondary windings, a second set of diodes connected across a second of the three secondary windings, and a third set of diodes connected across a third of the three secondary windings.

26. A current transformer according to claim 25, wherein the current transformer is a single phase current transformer having one aperture, one magnetic core and one secondary winding.

27. A current transformer according to claim 26, wherein the protection circuitry comprises a first diode connected across the secondary winding and a second diode connected in parallel with the first diode across the secondary winding, the first and second diodes being connected across the secondary winding in opposite directions.

28. A current transformer according to claim 26 wherein the protection circuitry comprises a Transil diode connected across the secondary winding.

29. A current transformer according to claim 25, wherein the protection circuitry and the connector socket are mounted to a circuit board located within the housing.

30. A current transformer according to claim 25, wherein each magnetic core substantially surrounds the respective aperture.

31. A current transformer according to claim 25, further comprising one or more busbars fixed within respective ones of the apertures.

32. A current transformer according to claim 25, wherein the socket is an RJ45 connector.

33. A current transformer according to claim 25, wherein the maximum output current of the secondary windings is one of 1 A and 5 A.

34. A current transformer according to claim 25, wherein each set of diodes comprises a first diode connected across a respective secondary winding and a second diode connected across the respective secondary winding in parallel with the first diode, the first and second diodes being connected across the secondary winding in opposite directions.

35. A current transformer according to claim 25, wherein each set of diodes comprises a Transil diode connected across a respective secondary winding.

36. A system for measuring electric current in a primary cable or busbar, comprising:
    a current transformer according to claim 25.

* * * * *